(12) United States Patent
Park

(10) Patent No.: US 9,879,925 B2
(45) Date of Patent: Jan. 30, 2018

(54) HEAT DISSIPATION SHEET MANUFACTURED USING GRAPHENE/GRAPHITE NANOPLATE/CARBON NANOTUBE/NANO-METAL COMPLEX AND METHOD OF MANUFACTURING THE SAME

(71) Applicant: WORLDTUBE CO. LTD, Gyeongsangnam-do (KR)

(72) Inventor: Young-Su Park, Gyeongsangnam-do (KR)

(73) Assignee: WORLDTUBE CO. LTD., Gyeongsangnam-Do (KR)

( * ) Notice: Subject to any disclaimer, the term of this patent is extended or adjusted under 35 U.S.C. 154(b) by 98 days.

(21) Appl. No.: 14/906,707

(22) PCT Filed: Aug. 5, 2013

(86) PCT No.: PCT/KR2013/007023
§ 371 (c)(1),
(2) Date: Jan. 21, 2016

(87) PCT Pub. No.: WO2015/012427
PCT Pub. Date: Jan. 29, 2015

(65) Prior Publication Data
US 2016/0153730 A1    Jun. 2, 2016

(30) Foreign Application Priority Data

Jul. 22, 2013   (KR) .................. 10-2013-0086166

(51) Int. Cl.
*F28F 21/02*     (2006.01)
*B29C 41/02*    (2006.01)
(Continued)

(52) U.S. Cl.
CPC ............... *F28F 21/02* (2013.01); *B29B 9/12* (2013.01); *B29B 13/08* (2013.01); *B29C 35/02* (2013.01);
(Continued)

(58) Field of Classification Search
CPC ...... F28F 13/18; F28F 21/02; H05K 7/20154; H05K 7/2039; B29C 41/02; B29C 65/4805
(Continued)

(56) References Cited

U.S. PATENT DOCUMENTS

2008/0193767 A1    8/2008   Lee et al.

FOREIGN PATENT DOCUMENTS

KR    10-2011-0115850    10/2011
KR    10-2012-0073792    7/2012
(Continued)

*Primary Examiner* — Matthew Matzek
(74) *Attorney, Agent, or Firm* — Susan Paik, Esq.

(57) ABSTRACT

To effectively dissipate heat discharged from various electronic or mechanical components, a high-performance ultra-thin heat dissipation sheet with high thermal conductivity and thermal emissivity by using a graphene/graphite nanoplate/carbon nanotube/nano-metal complex that forms a high-content 3D-structured complex that is stably dispersed, and a method of manufacturing the same, is provided. The method includes preparing a first heat dissipation film by sintering a composition for dissipating heat including a graphene/graphite nanoplate/carbon nanotube/nano-metal complex dispersion solution and a binder, and forming a second heat dissipation film on one surface or two opposite surfaces of the first heat dissipation film by using a graphene adhesive including the graphene/graphite nanoplate/carbon nanotube/nano-metal complex dispersion solution and an adhesive. A heat dissipation sheet according to the present invention may be utilized as a material with heat dissipation (Continued)

properties constituting a heat sink alone or with other materials with heat dissipation properties.

18 Claims, 6 Drawing Sheets

(51) Int. Cl.
| | |
|---|---|
| F28F 13/18 | (2006.01) |
| H05K 7/20 | (2006.01) |
| B29B 9/12 | (2006.01) |
| B29B 13/08 | (2006.01) |
| B29C 35/02 | (2006.01) |
| B29C 65/48 | (2006.01) |
| B32B 5/16 | (2006.01) |
| B32B 5/22 | (2006.01) |
| B32B 5/30 | (2006.01) |
| B32B 7/12 | (2006.01) |
| B29K 1/00 | (2006.01) |
| B29K 105/16 | (2006.01) |
| B29K 507/04 | (2006.01) |
| B29L 31/18 | (2006.01) |

(52) U.S. Cl.
CPC ............. *B29C 41/02* (2013.01); *B29C 65/48* (2013.01); *B32B 5/16* (2013.01); *B32B 5/22* (2013.01); *B32B 5/30* (2013.01); *B32B 7/12* (2013.01); *F28F 13/18* (2013.01); *H05K 7/20481* (2013.01); *B29K 2001/08* (2013.01); *B29K 2105/16* (2013.01); *B29K 2507/04* (2013.01); *B29K 2995/0013* (2013.01); *B29L 2031/18* (2013.01); *B32B 2264/108* (2013.01); *B32B 2264/12* (2013.01); *B32B 2307/302* (2013.01); *B32B 2457/00* (2013.01); *B32B 2457/08* (2013.01); *B32B 2457/202* (2013.01); *B32B 2457/206* (2013.01)

(58) Field of Classification Search
USPC ............... 428/221, 401; 977/734, 742, 753; 165/133, 185; 156/244
See application file for complete search history.

(56) References Cited

FOREIGN PATENT DOCUMENTS

| KR | 20120073792 A | * | 7/2012 |
|---|---|---|---|
| KR | 10-1175764 | | 8/2012 |
| KR | 10-2013-0011977 | | 1/2013 |

* cited by examiner

[Fig.1]
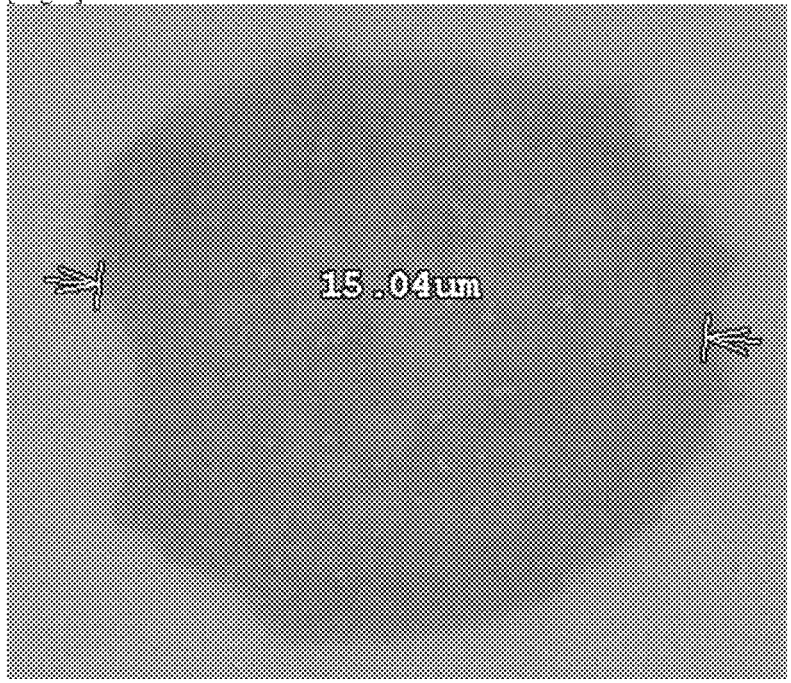
[Fig.2]
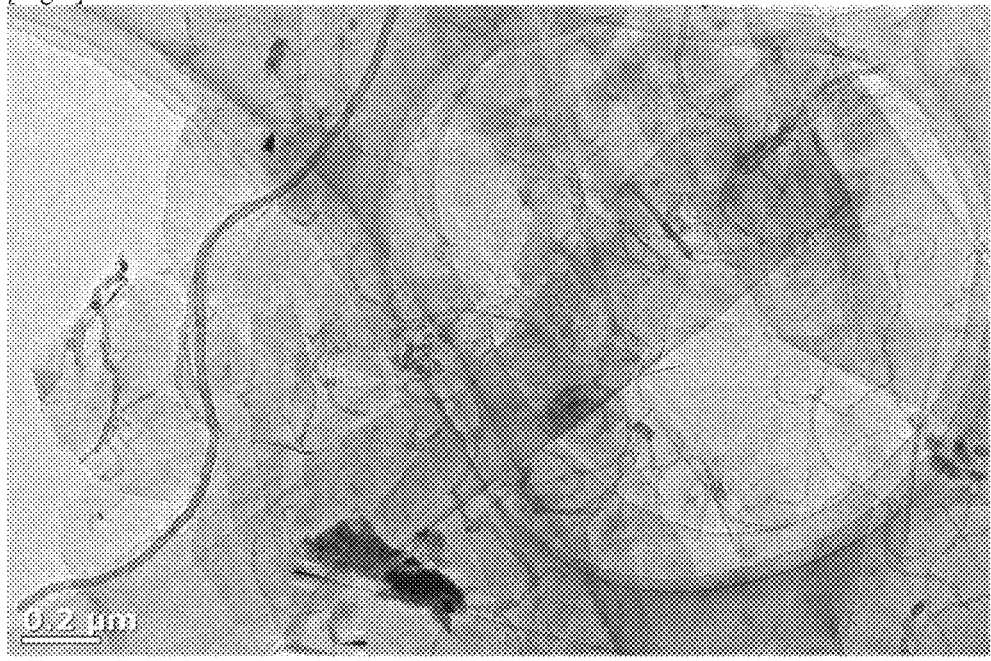

[Fig.3]
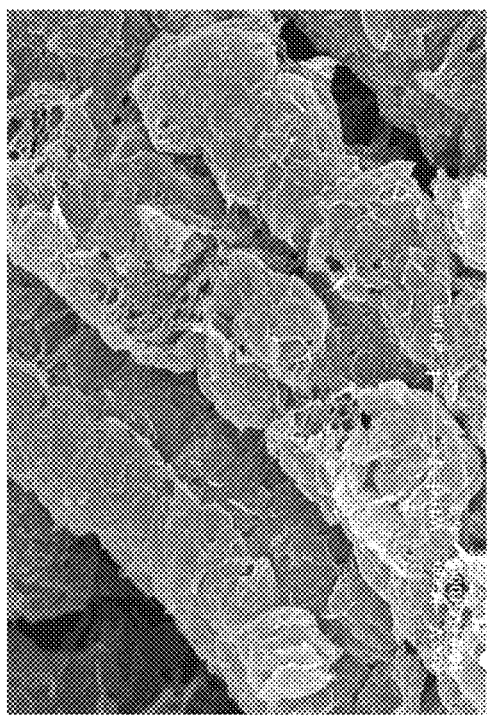
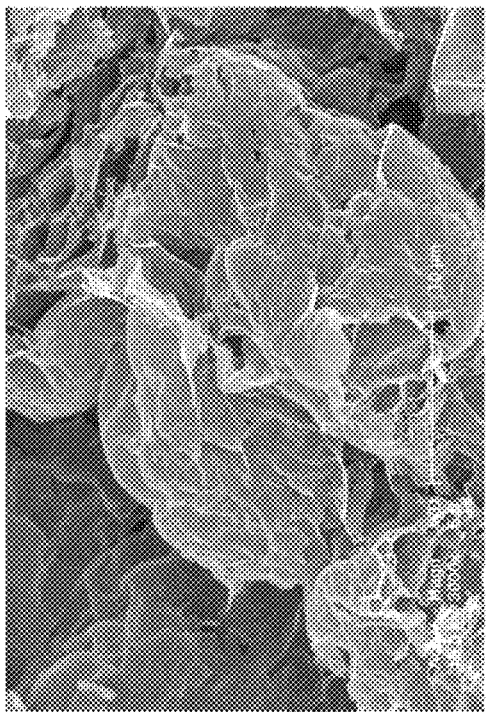
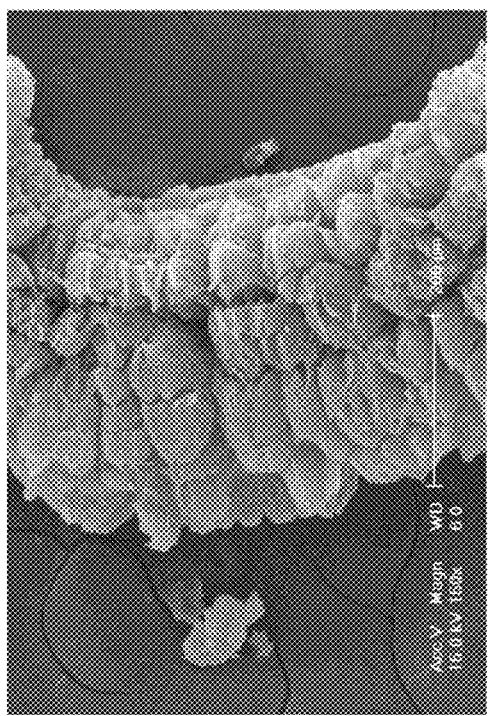

[Fig.4]
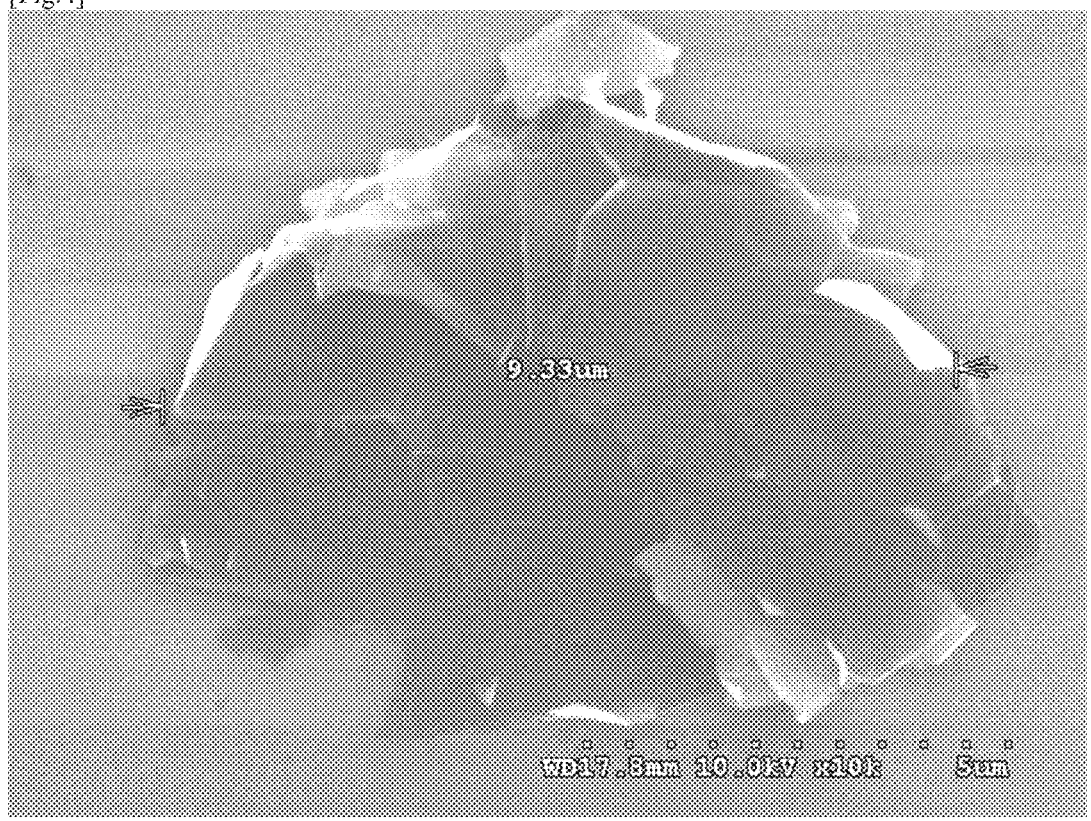

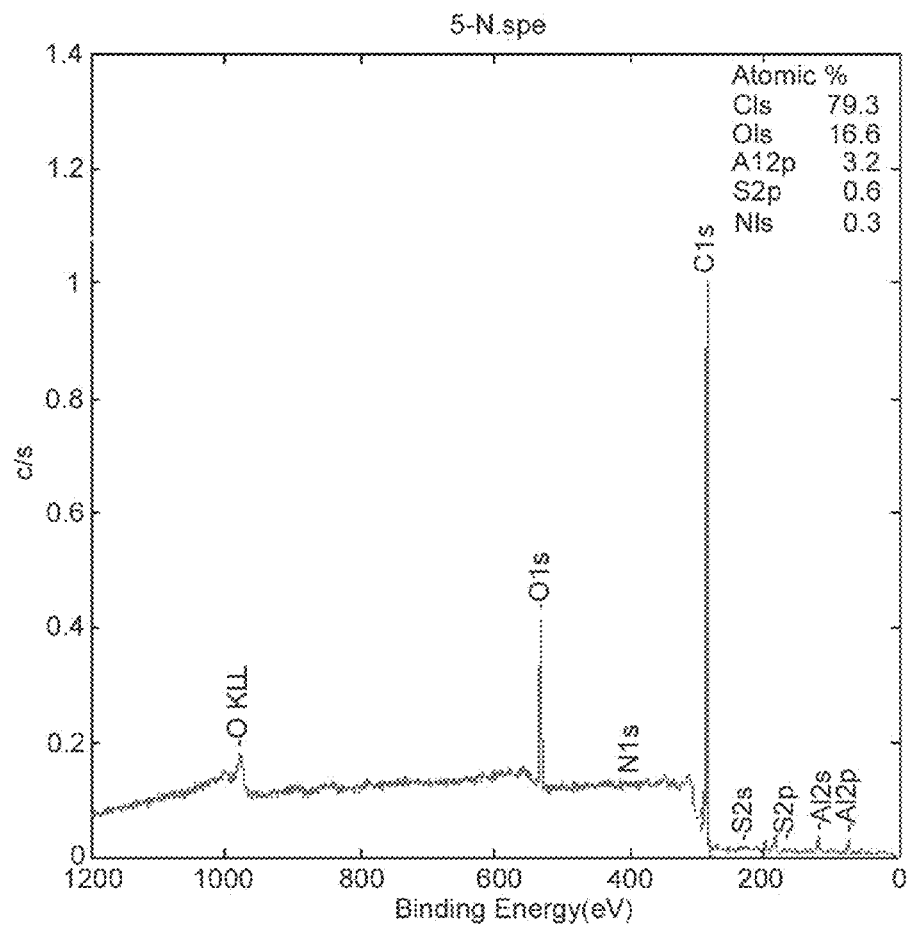

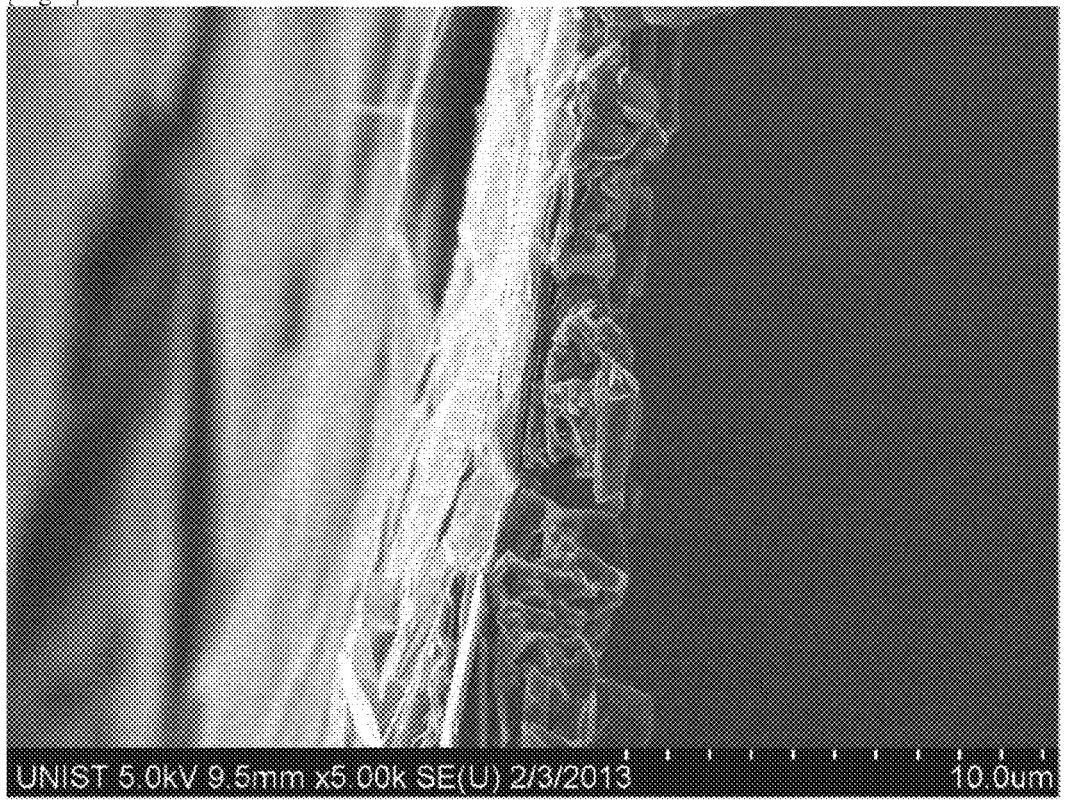
[Fig.6]

[Fig.7]
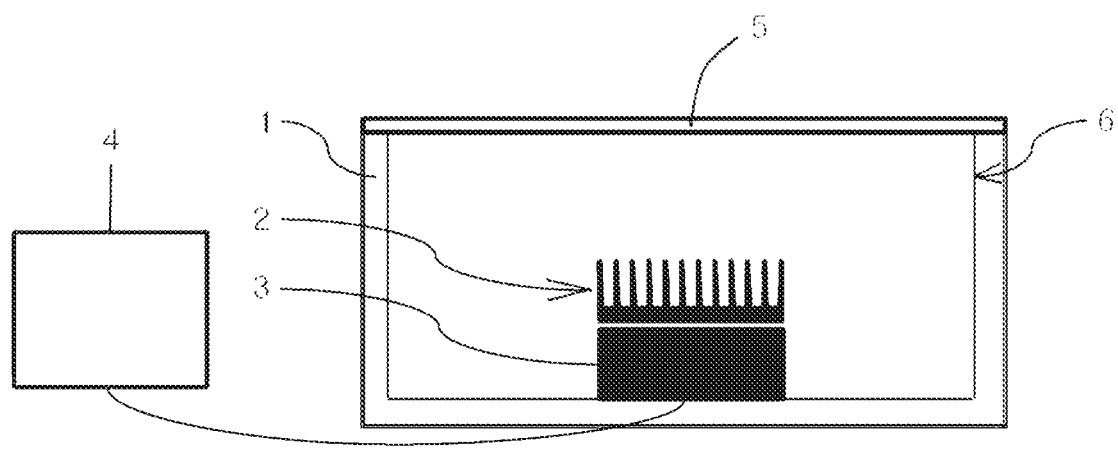

HEAT DISSIPATION SHEET MANUFACTURED USING GRAPHENE/GRAPHITE NANOPLATE/CARBON NANOTUBE/NANO-METAL COMPLEX AND METHOD OF MANUFACTURING THE SAME

TECHNICAL FIELD

The present invention relates to a heat dissipation sheet manufactured using a composition for dissipating heat which effectively dissipates heat discharged from various electronic or mechanical components, e.g., mobile phones, tablet computers, LED devices, chips of electronic circuits, vehicle engines, batteries, radiators of hot-air blowers and air conditioners, CPUs, LCDs, OLEDs, PDPs, etc., and a method of manufacturing the same.

BACKGROUND ART

Recently, integration according to high functionalization of electronic components causes rapid heat density increase due to resistance increase according to operation of the components. In addition, efficient dispersion and radiation of heat generated by fine-pitched operation circuits are important factors affecting increase of lifespan and reliability of electronic components.

So as to address such problems, various technologies are applied as heat radiation solutions. To accomplish heat dissipation, heat sinks, pans, heat pipes, etc. were generally used. Recently, development of thermally conductive composite materials prepared using carbon-based inorganic nanoparticles, particularly carbon nanotubes (CNTs) and graphene, as highly thermally conductive materials, is underway.

However, the materials attract attention as filling particles for heat dissipation materials based on high thermal conductivity as an intrinsic property thereof, but application of the materials to industries is difficult due to high contact resistance by phonon scattering, difficulties in controlling surface characteristics and securing dispersibility, etc.

SUMMARY OF THE INVENTION

Technical Problem

Therefore, the present invention has been made in view of the above problems, and it is an object of the present invention to provide an ultra-thin heat dissipation sheet manufactured using a 3D-structured graphene/graphite nanoplate/carbon nanotube/nano-metal complex and a method of manufacturing the same.

As described above, it is very difficult to disperse a graphene/carbon nanotube and it is far too difficult to perform dispersion such that the graphene/carbon nanotube has heat dissipation characteristics. Therefore, it is another object of the present invention to provide a high-performance ultra-thin heat dissipation sheet with high thermal conductivity and thermal emissivity by using a graphene/graphite nanoplate/carbon nanotube/nano-metal complex that forms a high-content 3D-structured complex that is stably dispersed, and a method of manufacturing the same.

Technical Solution

In accordance with an aspect of the present invention, the above and other objects can be accomplished by the provision of a method of manufacturing a heat dissipation sheet using a graphene/graphite nanoplate/carbon nanotube/nano-metal complex, the method comprising preparing a first heat dissipation film by coating and sintering a composition for dissipating heat comprising a graphene/graphite nanoplate/carbon nanotube/nano-metal complex dispersion solution and a binder on a substrate and then removing the substrate; and forming a second heat dissipation film on one surface or two opposite surfaces of the first heat dissipation film by using a graphene adhesive comprising the graphene/graphite nanoplate/carbon nanotube/nano-metal complex dispersion solution and an adhesive.

In accordance with another aspect of the present invention, there are provided a heat dissipation sheet manufactured using a graphene/graphite nanoplate/carbon nanotube/nano-metal complex, the heat dissipation sheet comprising a first heat dissipation film obtained by sintering a composition for dissipating heat comprising a graphene/graphite nanoplate/carbon nanotube/nano-metal complex dispersion solution and a binder; and a second heat dissipation film that comprises the graphene/graphite nanoplate/carbon nanotube/nano-metal complex dispersion solution and an adhesive and is formed on one surface or two opposite surfaces of the first heat dissipation film through coating or laminating, and a heat sink including the heat dissipation sheet.

Preferably, the forming may include preparing a second heat dissipation film by coating the graphene adhesive on a release film; and laminating a surface of the second heat dissipation film coated with the graphene adhesive on the one surface or two opposite surfaces of the first heat dissipation film.

Preferably, the graphene/graphite nanoplate/carbon nanotube/nano-metal complex dispersion solution may be prepared through a method comprising expanding expandable graphite to obtain graphene worms; repeating twice or more heat-treating the ground graphene worms after grinding the graphene worms cutting ground and heat-treated graphene worms while homogenizing by means of a high pressure homogenizer after mixing the ground and heat-treated graphene worms with a solvent; forming a graphene/graphite nanoplate/nano-metal complex dispersion solution by adding a metal alkoxide coupling agent to a graphene layer binder dispersion solution obtained through the homogenizing and cutting and then performing ultrasonication; and forming a graphene/graphite nanoplate/carbon nanotube/nano-metal complex by adding an aqueous carbon nanotube dispersion solution to the formed graphene/graphite nanoplate/nano-metal complex dispersion solution and then stirring.

Preferably, the substrate may be a thin metal or plastic film.

The binder may be at least one binder resin selected from the group consisting of ethylcellulose resin, methylcellulose resin, and carboxymethylcellulose resin, or a mixture of at least one solvent selected from the group consisting of water, alcohol, methylethylketone, toluene, xylene, butylacetate, ethylacetate, isobutylacetate, cellosolveacetate, ethylcellosolve, and butylcellosolve and the binder resin.

Preferably, the graphene/graphite nanoplate/carbon nanotube/nano-metal complex dispersion solution may be included in an amount of 10 to 95% by weight in the composition for dissipating heat.

Preferably, the sintering may be performed at 400 to 600° C. for 1 to 40 minutes.

Preferably, the graphene adhesive may include 30 to % by weight of the graphene/graphite nanoplate/carbon nanotube/nano-metal complex dispersion solution and 40 to 70% by weight of the adhesive, and the adhesive may be any one of acrylic adhesives, silicon-based adhesives, and rubber-based adhesives.

The laminating may be performed by rolling under a pressure of 350 to 700 kg.

Preferably, the substrate may be coated with the composition for dissipating heat to a thickness of 30 to 100 µm, and the release film may be coated with the graphene adhesive to a thickness of 2 to 20 µm. The thickness of a finally obtained heat dissipation sheet is preferably 10 to 150 µm.

The heat sink may further include, other than the heat dissipation sheet according to the present invention, any one of metals, ceramics with heat dissipation properties, and polymers with heat dissipation properties.

Advantageous Effects

A heat dissipation sheet manufactured by sintering a composition for dissipating heat using a 3D-structured graphene/graphite nanoplate/carbon nanotube/nano-metal complex dispersion solution according to the present invention includes nano-metal ingredients melted in a graphene/graphite nanoplate/carbon nanotube/nano-metal complex and thus forms a 3D-structured graphene/graphite nanoplate/carbon nanotube thin film, thereby having excellent radiation absorption and radiation emission characteristics. Accordingly, when the heat dissipation sheet is used as a heat sink through complexation with an existing metal-based bulk-type heat sink or a sheet/grease-type polymer, heat dissipation characteristics are enhanced, the content of metal matrix is decreased, and flexible designing to realize miniaturization and weight reduction of the heat sink, such as easy polymer molding, is possible.

In addition, heat discharge problems can be efficiently addressed by enhancing cooling efficiency of a heat dissipation component and functioning as a heat diffusion layer for uniformly transferring heat. Accordingly, energy efficiency of electronic equipment is increased, and a heat sink for dissipating heat may be miniaturized or removed. Therefore, the heat dissipation sheet is suitable for a heat dissipation member of electronic equipment that gradually becomes lightweight, short, and small.

BRIEF DESCRIPTION OF THE DRAWINGS

The above and other objects, features and other advantages of the present invention will be more clearly understood from the following detailed description taken in conjunction with the accompanying drawings, in which:

FIG. 1 illustrates a transmission electron microscope (TEM) image of nano-metal bonded to a graphene surface;

FIG. 2 illustrates a TEM image of a carbon nanotube bonded to graphene;

FIG. 3 illustrates a scanning electron microscope (SEM) image of graphene worms obtained through expansion;

FIG. 4 illustrates an SEM image of ground graphene worms;

FIG. 5 illustrates an X-ray photoelectron spectroscopy (XPS) result for a graphene/graphite nanoplate/carbon nanotube/nano-metal complex;

FIG. 6 illustrates an SEM image for a cross section of a heat dissipation sheet according to the present invention; and FIG. 7 illustrates a device for testing heat dissipation characteristics.

DETAILED DESCRIPTION

It is to be understood that terms such as "comprises" and/or "comprising" are intended to indicate the existence of the features, steps, or combinations thereof, and are not intended to preclude the possibility that one or more other features, steps, or combinations thereof may exist or may be added. Unless otherwise defined, all terms (including technical and scientific terms) used herein have the same meaning as commonly understood by one of ordinary skill in the art to which this inventive concept pertains.

A method of manufacturing a heat dissipation sheet using a graphene/graphite nanoplate/carbon nanotube/nano-metal complex according to the present invention includes:

preparing a first heat dissipation film by coating and sintering a composition for dissipating heat comprising a graphene/graphite nanoplate/carbon nanotube/nano-metal complex dispersion solution and a binder on a substrate and then removing the substrate; and forming a second heat dissipation film on one surface or two opposite surfaces of the first heat dissipation film by using a graphene adhesive comprising the graphene/graphite nanoplate/carbon nanotube/nano-metal complex dispersion solution and an adhesive.

In addition, a heat dissipation sheet manufactured using a graphene/graphite nanoplate/carbon nanotube/nano-metal complex according to the present invention includes the first heat dissipation film and a second heat dissipation film formed on one surface or two opposite surfaces of the first heat dissipation film.

Hereinafter, the constitutions and the manufacturing method are respectively described in detail with reference to the following preferred embodiments. However, embodiments of the present invention are not limited to the following preferred embodiment and the present invention may be embodied in many different forms.

<Graphene/Graphite Nanoplate/Carbon Nanotube/Nano-Metal Complex Dispersion Solution>

Graphene and carbon nanotube, representative nano-materials recently attracting attention, are physicochemically very stable and have excellent mechanical, electrical, and thermal characteristics. In particular, since graphene has a thermal conductivity of about 6,000 W/mK or more, it exhibits thermal characteristics about 10-times higher than that of copper and aluminum. In addition, since graphene and a carbon nanotube have high thermal conductivity and high thermal emissivity, superior heat dissipation characteristics, which are not exhibited in existing heat dissipation materials, are exhibited when they are used in adhesives, coating agents, tapes, pads, and complexes with thermal conductivity.

In the present invention, since it is difficult to disperse powder-type graphene and carbon nanotubes, the graphene and carbon nanotube are preferably included as dispersion solutions dispersed in a specific solvent such that the graphene and carbon nanotube are dispersed in a composition for dissipating heat.

The graphene/graphite nanoplate/carbon nanotube/nano-metal complex dispersion solution may be prepared as described below.

1. Expansion Step

First, graphene worms are obtained by expanding expandable graphite including a graphene layer with a completely stacked AB arrangement.

The expandable graphite has a carbon purity of 95% or more, preferably a carbon purity of 99% or more. In addition, the expandable graphite may have an expansion rate of 350-times or more. Further, the expandable graphite has an expansion start temperature of 200 to 300° C., preferably an expansion start temperature of 230 to 270° C. Preferably, the expandable graphite has an average particle size of 50 mesh or less.

The expandable graphite used in the present invention is preferably prepared by injecting a sulfur or nitrogen compound into natural graphite.

The expandable graphite may be expanded by means of a generally used gas torch. For example, the expandable graphite may be expanded by feeding the expandable graphite into flame under an oxygen atmosphere after adhering a gas torch to an SUS pipe with a length of 2 to 6 cm and a diameter of 60 mm.

The reason why the expandable graphite is formed into graphene worms through the device is examined. Since graphite has an intrinsic layered structure, atoms or small molecules may be inserted between layers. When a sulfur or nitrogen compound is injected into such layers and then heat treatment is performed, the layers are separated from each other like an accordion and expanded several hundred fold.

2. Grinding and Heat-Treating Step

The expanded graphene worms are ground and then a step of heat-treating obtained ground graphene worms are repeated twice or more.

The expanded graphene worms are ground at 15,000 to 30,000 rpm for five minutes or less by means of a grinder. More preferably, the grinding is carried out for three minutes or less. When the grinding is carried out at a rate of less than 15,000 rpm, it is difficult to obtain effects through the grinding. When the grinding is carried out at a rate of greater than 30,000 rpm, the size of the graphene worms are excessively reduced, and thus, properties of a final product are deteriorated.

When the grinding is carried out for greater than five minutes, the graphene worms are excessively cut, and thus, in a subsequent process, the generation fraction of each grapheme sheet with an average particle size of 1 µm or less and a graphite nanoplate with less layers are increased. Accordingly, contact resistance between surfaces is increased, and thus, there are problems in that the graphene and graphite nanoplate exhibit desired properties. In addition, when the grapheme has an average particle size of 1 µm or less, electrical properties are greatly decreased.

The grinding step is introduced to increase generation fractions of the graphene and the graphite nanoplate and reduce the time taken in a subsequent process by decreasing bonding between layers of the graphene worms obtained through the expansion step. This is the same as the principle that a rope composed of several strands is easily loosed by cutting. In addition, when graphite non-expanded and partially expanded due to irregular behaviors of particles is subjected to the heat treatment after the grinding step, the area thereof exposed to a heat source is increased and more complete reduction may be carried out.

The graphene worms ground according to the method is subjected to the heat treatment at 700 to 1,700° C. by means of the device used in "1. Expansion step". When the heat treatment is carried out at less than 700° C., it is difficult to accomplish a desired expansion rate and reduction rate. When the heat treatment is carried out at greater than 1,700 □, there are problems of costs.

The grinding and heat-treating steps are preferably repeated twice to five times. By repeating the grinding and heat-treating step twice to five times, the amount of oxygen remaining in the graphene worms may be minimized and the generation fractions of the graphene and the graphite nanoplate may be increased.

3. Homogenizing and Cutting Step

The graphene worms obtained through the grinding and heat-treating step is dispersed in a solvent and then cut while homogenizing by means of a high pressure homogenizer. As a result, a graphene layer binder dispersion solution is obtained.

The homogenizing and cutting step is preferably for 0.2 to 5 hours by means of a high pressure homogenizer. When the homogenizing and cutting are carried out for less than 0.2 hours, wetting and cutting effects for a material are slight. When the homogenizing and cutting are carried out for greater than five hours, results are not further increased and costs are increased.

When the homogenizing and the cutting are carried out by means of the high pressure homogenizer, the graphene worms may be stably dispersed in a solvent, the graphene worms are cut through a high pressure homogenization process, and the generation fractions of the graphene and the graphite nanoplate may be maximized.

The solvent may be one or a mixture of two or more selected from the group consisting of water, alcohol, methylethylketone, toluene, xylene, butylacetate, ethylacetate, isobutylacetate, cellosolveacetate, ethylcellosolve, butylcellosolve, and N-methylpyrrolidone.

4. Graphene/Graphite Nanoplate/Nano-Metal Complex Formation Step Through Ultrasonication The graphene layer binder dispersion solution obtained through the homogenizing and cutting step is subjected to ultrasonication by means of ultrasonic homogenizer to prepare a mixed dispersion solution including the graphene and the graphite nanoplate.

A metal alkoxide coupling agent is added to the graphene layer binder dispersion solution obtained through the homogenizing and cutting step and then ultrasonication is carried out by means of an ultrasonic homogenizer with an output of 10 to 30 kW. Finally, a mixed dispersion solution including the graphene, the graphite nanoplate, and the nano-metal complex may be obtained.

The metal alkoxide coupling agent may be a zircoaluminate coupling agent, a titanate-based coupling agent, an aluminate-based coupling agent, a zirconate-based coupling agent, etc. Preferably, the metal alkoxide coupling agent is a zircoaluminate coupling agent. Since a metallic portion of such a metal alkoxide coupling agent covalently binds to a hydroxy group of the graphene layer binder surface, each of the grapheme and the graphite nanoplate may be easily separated in a solvent and the generation fraction of the graphene/graphite nanoplate/nano-metal complex may be increased within a short time. In addition, the metal alkoxide coupling agent is added in an amount of 0.1 to 3% by weight based on the total weigh of the dispersion solution. When the coupling agent is used in an amount of less than 0.1% by weight, the generation fraction of the graphene/graphite nanoplate/nano-metal complex is decreased. When the coupling agent is used in an amount of greater than 3% by weight, the coupling agent may be coagulated to each other.

When the graphene layer binder cut and stabilized in the solvent through the homogenization process is subjected to an ultrasonic dispersion treatment, sound wave cavitation is induced near the graphene layer binder surface, thereby inducing partial erosion of the graphene layer binder layer. In addition, bonding force between graphene layers due to intense bubble collapse is weakened and thus the generation fractions of each graphene, a graphite nanoplate with a small number of layers, and nano-metal complex may be maximized.

However, since such ultrasonication is somewhat a destructive method, the sizes of the graphene and graphite nanoplate particles are extremely decreased when operation time is extended and thus the properties of the graphene and the graphite nanoplate are deteriorated. Therefore, the ultrasonication is preferably carried out for 16 hours or less.

5. 3D-Structured Graphene/Graphite Nanoplate/Carbon Nanotube/Nano-Metal Complex Formation Step An aqueous carbon nanotube dispersion solution dispersed using an anionic dispersant is added to the ultrasonicated graphene/graphite nanoplate/nano-metal complex dispersion solution, followed by stirring. As a result, a 3D-structured graphene/graphite nanoplate/carbon nanotube/nano-metal complex is formed.

As the aqueous carbon nanotube dispersion solution, a solution suggested in Korean Patent No. 1011367760000, applied by an applicant of the present invention, entitled "method of preparing nanocarbon dispersion solution, nanocarbon dispersion solution using the same, method of evaluating nanocarbon, and method of preparing nanocarbon material" is used.

In particular, a mixture including 97% by weight of water and 3% by weight of a carbon nanotube is fed into a nanomizer, and cutting is carried out for 0.5 hours such that the average particle size of a nanocarbon bundle is about 0.2 μm. A mixture including the cut nanocarbon bundles is mixed with 50 to 200 parts by weight of a dispersant NADDBS based on 100 parts by weight of the carbon nanotube. Subsequently, a resultant mixture is fed into an ultrasonic homogenizer, followed by treating for one hour. As a result, a dispersion solution including 3% by weight of the carbon nanotube is prepared. 20 to 50 parts by weight of the carbon nanotube dispersion solution are mixed with 100 parts by weight of the graphene/graphite nanoplate/nano-metal complex dispersion solution. Subsequently, stirring is carried out for one hour by means of a homomixer. As a result, a graphene/graphite nanoplate/carbon nanotube/nano-metal complex dispersion solution is prepared.

A dispersion solution with a desired solid content may be obtained through filtration of the prepared graphene/graphite nanoplate/carbon nanotube/nano-metal complex dispersion solution. The solid content is preferably 5 to 30% by weight. When the content of the solid content is less than 5% by weight, performances of a final heat dissipation composition are decreased. When the content of the solid content is 30% by weight or more, workability is dramatically decreased and production costs are extremely increased.

The graphene/carbon nanotube/graphite nanoplate/nano-metal complex prepared as described above forms a high-content 3D-structured complex that is stably dispersed, thus having high thermal conductivity and thermal emissivity.

FIG. 1 illustrates a TEM image of nano-metal bonded to a graphene surface, FIG. 2 illustrates a TEM image of a carbon nanotube bonded to graphene, and FIG. 5 illustrates an XPS result for a graphene/graphite nanoplate/carbon nanotube/nano-metal complex.

<Composition for Dissipating Heat>

The composition for dissipating heat According to the present invention includes the graphene/graphite nanoplate/carbon nanotube/nano-metal complex dispersion solution and a binder. Preferably, the graphene/graphite nanoplate/carbon nanotube/nano-metal complex dispersion solution is included in an amount of 10 to 95% by weight. In the graphene/graphite nanoplate/carbon nanotube/nano-metal complex dispersion solution, a solid content is preferably 5 to 30% by weight. When the solid content is less than 5% by weight, performances of a final heat dissipation composition are deteriorated. When the solid content is greater than 30% by weight, workability is remarkably decreased and production costs are greatly increased.

As the binder, a mixture of a binder resin and a solvent or a solid-type binder resin dissolved in a dispersion solution may be used. The binder resin may be one or more selected from the group consisting of ethylcellulose, methylcellulose, and carboxymethylcellulose resins, as cellulose-based binders. The solvent may be one or more selected from the group consisting of water, alcohol, methylethylketone, toluene, xylene, butylacetate, ethylacetate, isobutylacetate, cellosolveacetate, ethylcellosolve, and butylcellosolve.

In the composition for dissipating heat, the binder is preferably included in an amount of 5 to 30% by weight. When the content of the binder is less than 5% by weight, it is difficult the binder with the graphene/graphite nanoplate/carbon nanotube/nano-metal complex, and adhesion between graphene/graphite nanoplate/carbon nanotube/nano-metal layers may be decreased during a sintering process. When the content of the binder is 30% by weight or more, time taken to remove the binder is extended during a sintering process, whereby production costs are increased and heat dissipation performances are deteriorated.

<Graphene Adhesive>

The graphene adhesive includes the graphene/graphite nanoplate/carbon nanotube/nano-metal complex dispersion solution and an adhesive. The graphene adhesive is prepared through mixing of the graphene/graphite nanoplate/carbon nanotube/nano-metal complex dispersion solution and the adhesive. Preferably, the graphene adhesive is prepared through stirring at 500 to 4000 rpm for 20 minutes by means of a high speed stirrer.

The graphene adhesive preferably includes 30 to 60% by weight of the graphene/graphite nanoplate/carbon nanotube/nano-metal complex dispersion solution. As the adhesive, an acrylic adhesive, a silicon-based adhesive, a rubber-based adhesive, or the like may be used. The adhesive is preferably included in an amount of 40 to 70% by weight in the graphene adhesive.

<Heat Dissipation Sheet>

The heat dissipation sheet according to the present invention includes a first heat dissipation film obtained by sintering the composition for dissipating heat and a second heat dissipation film formed on one surface or two opposite surfaces of the first heat dissipation film and composed of the graphene adhesive. A method of manufacturing the heat dissipation sheet includes a step of manufacturing the a first heat dissipation film; and a step of forming the second heat dissipation film on one surface or two opposite surfaces of the first heat dissipation film. So as to form the second heat dissipation film on one surface or two opposite surfaces of the first heat dissipation film, a method of performing lamination after separately manufacturing the second heat dissipation film or a method of forming the second heat dissipation film by directly coating the first heat dissipation film with the graphene adhesive may be used.

1. Manufacture of First Heat Dissipation Film

A substrate is coated with the composition for dissipating heat to manufacture a first heat dissipation film.

As the substrate, a thin metal or a plastic film may be used. For example, the substrate may be a thin-film sheet wherein one surface of a polyimide, aluminum, or copper foil is released.

As a method of coating the substrate with the composition, general coating methods, e.g., comma coating, gravure coating, roll-to-roll coating, or the like may be used.

The substrate is preferably coated with the composition to a thickness of 30 to 100 μm. When the thickness is greater than 100 μm, costs are increased and cracks may be generated. When the thickness is less than 30 μm, superior heat dissipation performance is not exhibited.

When coating of the composition for dissipating heat is completed, a coated film should be sintered. The sintering is preferably carried out at 400 to 600° C. for 1 to 40 minutes to obtain a sintered coating layer. More preferably, the sintering is carried out at 400 to 500° C. The binder resin including in the composition for dissipating heat is removed through the sintering.

Next, the sheet, which is used as substrate, is removed from the sintered coating layer to manufacture a first heat dissipation film.

2. Manufacture of Second Heat Dissipation Film

A PET release film is coated with the graphene adhesive to a thickness of 2 to 20 μm to manufacture a second heat dissipation film. The graphene adhesive is more preferably coated to a thickness of 3 to 10 μm. When the thickness of the coating is less than 3 μm, adhesion and heat dissipation performance are deteriorated. When the thickness of the coating is greater than 10 μm, production costs are increased and thus heat resistance is increased.

3. Manufacture of Heat Dissipation Sheet

A surface, which is coated with the graphene adhesive, of the aforementioned second heat dissipation film is laminated on one surface or two opposite surfaces of the aforementioned first heat dissipation film to obtain a heat dissipation sheet according to the present invention. Preferably, the second heat dissipation film is laminated on two opposite surfaces of the first heat dissipation film. The laminating is carried out by rolling under a pressure of preferably 350 to 700 kg, more preferably 450 kg. The thickness of a final heat dissipation sheet is preferably 10 to 150 μm. When the rolling is carried out to a thickness of less than 10 μm, production costs are greatly increased. When the rolling is carried out to a thickness of greater than 150 μm, a sheet is easily broken and it is difficult to anticipate desired heat dissipation performances.

As a result, an ultra-thin heat dissipation sheet with a vertical thermal conductivity of 3 W/mK and a horizontal thermal conductivity of 300 W/mk or more may be manufactured.

The heat dissipation sheet of the present invention obtained as described above may constitute a heat sink alone or with other materials with heat dissipation properties. As the materials with heat dissipation properties, metals such as aluminum with superior thermal conductivity, known polymers with heat dissipation properties, ceramics with heat dissipation properties, and the like may be used. In particular, when the heat dissipation sheet of the present invention is used in an existing metal-based bulk-type heat sink or a heat sink produced complexation with a sheet/grease-type polymer, heat dissipation characteristics are enhanced, the content of metal matrix is decreased, moldability of a polymer may be facilitated, and flexible designing to realize miniaturization and weight-lightening of the heat sink becomes possible. A heat sink including the heat dissipation sheet of the present invention may be used to dissipate heat discharged from various electronic or mechanical components, e.g., LED devices, chips of electronic circuits, lines, vehicle engines, radiators, batteries, radiators of hot-air blowers and air conditioners, CPU, etc.

EXAMPLES

Hereinafter, the present invention will be described in more detail with reference to the following Examples. The scope of the present invention is not limited to the following Examples and covers modifications of the technical spirit substantially equivalent thereto.

Example 1

Preparation of Graphene/Graphite Nanoplate/Carbon Nanotube/Nano-Metal Complex Dispersion Solution A graphene/graphite nanoplate/carbon nanotube/nano-metal complex dispersion solution was prepared from expandable graphite according to the following methods.

1. Expansion Step

Commercially available natural graphite ES 350 F5, as expandable graphite by manufactured by GK Group in Germany, including a mixture of sulfuric acid and nitric acid inserted between layers of the natural graphite was used. The expandable graphite has a carbon purity of 99%, an expansion rate of 350 folds, an expansion start temperature of 250° C., and an average particle size of 50 meshes.

A gas torch was connected to an SUS pipe with a length of 2 to 6 m and a diameter of 60 mm. Subsequently, the expandable graphite was fed into flame at 700 to 1700° C. under an oxidization atmosphere and heat treatment was carried out. As a result, graphene worms were obtained.

Graphene worms obtained through expansion were observed and the shapes thereof are illustrated in FIG. 3.

2. Grinding and Heat-Treating Step

The graphene worms obtained according to the aforementioned method was ground at 15,000 to 30,000 rpm for three minutes or less by means of a grinder.

Graphene layer binders obtained through the grinding step were observed through an SEM, and the shapes thereof are illustrated in FIG. 4. When FIGS. 3 and 4 are compared, it can be confirmed that binding force between graphene layers is decreased through the graphene worms grinding process, and thus, the generation fractions of each graphene sheet and a graphite nanoplate having less layers are increased, whereby the time taken for a subsequent process may be reduced.

The graphene worms ground according to the aforementioned method was heat-treated at 700 to 1700 ☐ by means of the device used in "1. Expansion step".

Subsequently, a grinding process and a heat-treatment process were additionally, respectively repeated four times.

3. Homogenizing and Cutting Step 50 g of the graphene worms obtained according to the aforementioned method was dispersed in 950 g of an ethylcellosolve solvent and then homogenized and cut for two hours in a high pressure homogenizer. As a result, a graphene layer binder dispersion solution was obtained.

4. Formation Step of Graphene/Graphite Nanoplate/Nano-Metal Complex Through Ultrasonication A zircoaluminate coupling agent (chart well 515.1) was added in an amount of 1% by weight, based on the total weight, to the graphene layer binder dispersion solution obtained through the aforementioned method. Subsequently, ultrasonication was carried out for about two hours by means of an ultrasonic homogenizer with an output of 20 KHz/1,500 W. Finally, a graphene/graphite nanoplate/nano-metal complex dispersion solution was obtained. FIG. 1 illustrates a transmission electron microscope (TEM) image of nano-metal bonded to a graphene surface.

5. Formation Step of 3D-Structured Graphene/Graphite Nanoplate/Carbon Nanotube/Nano-Metal Complex 30 g of a carbon nanotube was mixed with 970 g of distilled water. Subsequently, a resultant mixture was fed into a nanomizer, and cutting was carried out for 0.5 hours such that the average particle size of nanocarbon bundles became about 0.2 μm. The mixture including the cut nanocarbon bundle was mixed with 30 g of NADDBS and then treated for one hour in an ultrasonic homogenizer with an output of 20 KHz/1,500 W. As a result, a dispersion solution including 3% by weight of the carbon nanotube was prepared. 400 g of a carbon nanotube dispersion solution was added to 1,000 g of the graphene/graphite nanoplate/nanometal complex dispersion solution obtained through this step "5. Formation step of 3D-structured graphene/graphite nanoplate/carbon nanotube/nano-metal complex", and stirring was carried out at 2,000 rpm for one hour by means of a homomixer. As a result, a 3D-structured graphene/graphite nanoplate/carbon nanotube/nano-metal complex dispersion solution was prepared. FIG. 2 illustrates a TEM image of a carbon nanotube bonded to graphene.

The prepared dispersion solution was filtered to prepare a graphene/graphite nanoplate/carbon nanotube/nano-metal complex dispersion solution including 30% by weight of a solid. An X-ray photoelectron spectroscopy (XPS) result for this graphene/graphite nanoplate/carbon nanotube/nano-metal complex is illustrated in FIG. 5.

Examples 2 to 5

Preparation of Compositions for Dissipating Heat

Compositions for dissipating heat were prepared by stirring at 500 to 4000 rpm for 20 minutes by means of a high speed stirrer, using compositions summarized in Table 1 below. Here, an ethylcellulose resin was used as a binder.

TABLE 1

| Ingredients | Example 2 | Example 3 | Example 4 | Example 5 |
|---|---|---|---|---|
| Binder | 5 | 10 | 20 | 30 |
| Complex dispersion solution of the present invention | 95 | 90 | 80 | 70 |

Examples 6 to 9

Preparation of Graphene Adhesives

Graphene adhesives were prepared by stirring at 500 to 4000 rpm for 20 minutes by means of a high speed stirrer, using compositions summarized in Table 2 below. Here, an acrylic adhesives resin including a solid of 45% in an ethyl acetate solvent was used as an adhesive.

TABLE 2

| Ingredients | Example 6 | Example 7 | Example 8 | Example 9 |
|---|---|---|---|---|
| adhesive | 40 | 50 | 60 | 70 |
| Complex dispersion solution of the present invention | 60 | 50 | 40 | 30 |

Example 10

Preparation of Heat Dissipation Sheet (1) The composition for dissipating heat prepared according to Example 3 of the present invention was coated to a thickness of 100 μm through comma coating on an outer surface of an aluminum foil that was release-treated with silicon to a thickness of 35 μm. Subsequently, firing was performed for seven minutes at 450° C. to sinter a coating film was sintered by performing and then the aluminum foil used as a substrate was removed. As a result, a first heat dissipation film was obtained.

(2) A PET film was coated with the graphene adhesive prepared according to Example 6 to a thickness of 6 μm, thereby manufacturing a second heat dissipation film.

(3) The graphene adhesive coating surface of the second heat dissipation film obtained from (2) was laminated on two opposite surfaces of the first heat dissipation film obtained from (1), and rolling was carried out under a pressure of 450 kg. As a result, a complete heat dissipation sheet was manufactured. FIG. 6 illustrates an SEM image of a cross section of the prepared heat dissipation sheet.

Experimental Example 1

The heat dissipation characteristics of the compositions for dissipating heat prepared according to Examples 2 to 5 and the graphene adhesives prepared according to Examples 6 to 9 were evaluated as described below.

So as to evaluate the heat dissipation characteristics, a test device was manufactured as illustrated in FIG. 7. The exterior of the test device illustrated in FIG. 7 was made of a styrofoam 1, the interior of the styrofoam 1 was lined with an aluminum foil 6, and a thermoelectric semiconductor heater 3 connected to an input current controller 4 that included a K-type temperature sensor attached thereto was disposed at the center of the bottom of the test device. In addition, a K-type interior thermometer (not shown) was attached to the interior of the device to measure internal temperature changes.

An aluminum heat sink 2 was coated to a thickness of 20 μm with each of the compositions for dissipating heat prepared according to Examples 2 to 5 and the graphene adhesives prepared according to Examples 6 to 9, and attached to a thermoelectric semiconductor heater block. Subsequently, current of 1.223 A was applied to thermoelectric semiconductor heater 3 in a rated current control manner, and, after 15 minutes, temperature changes in the heater 3 were measured. Measured results are summarized in Table 3 below.

TABLE 3

| Examples | Interior temperature | Heater block | ΔT | Interior | Heat sink attachment temperature | ΔT | Measurement time | ΣΔT | Note |
|---|---|---|---|---|---|---|---|---|---|
| 2 | 25.3 | 72 | 46.7 | 25.3 | 56.4 | 31.1 | 15 min | 15.6 | Coated surface flaked |

TABLE 3-continued

| Examples | Interior temperature | Heater block | ΔT | Interior | Heat sink attachment temperature | ΔT | Measurement time | ΣΔT | Note |
|---|---|---|---|---|---|---|---|---|---|
| 3 | 25.4 | 72.1 | 47 | 25.4 | 43.1 | 17.7 | 15 min | 29 | |
| 4 | 25.5 | 72.2 | 46.7 | 25.5 | 48.9 | 23.4 | 15 min | 23.3 | |
| 5 | 25.2 | 71.9 | 46.7 | 25.2 | 52.7 | 27.5 | 15 min | 19.2 | |
| 6 | 25.3 | 72 | 46.7 | 25.3 | 53.2 | 27.9 | 15 min | 18.8 | |
| 7 | 25.4 | 72.1 | 46.7 | 25.4 | 54.6 | 29.2 | 15 min | 17.5 | |
| 8 | 25.5 | 72.2 | 46.7 | 25.5 | 56.2 | 30.7 | 15 min | 16 | |
| 9 | 25.2 | 71.9 | 46.7 | 25.2 | 57.7 | 32.5 | 15 min | 14.2 | |

It was confirmed that all of the composition for dissipating heat according Examples 2 to 5 and the graphene adhesive according to Examples 6 to 9 have excellent heat dissipation performances. In particular, it was confirmed that heat dissipation performances of Examples 3 and 6 are most excellent. In addition, it was confirmed that, based on Example 3, heat dissipation performance are decreased with increasing binder contents. In addition, in Example 2 including the binder in a lower content than Example 3, some coating films are flaked due to the lack of the binder. Further, based on Example 6, heat dissipation performances are decreased with increasing graphene adhesive contents.

Experimental Example 2

Heat dissipation characteristics of the heat dissipation sheet according to Example 10 were evaluated by means of the device illustrated in FIG. 7.

A current of 1.223 A was applied to the thermoelectric semiconductor heater 3 in a rated current control manner and a heat dissipation sheet was processed into a size of 100 mm×100 mm. The processed heat dissipation sheet was attached to a thermoelectric semiconductor heater block with a size of 30 mm×30 mm. After 15 minutes, temperature changes in the heater were measured. Measured results are summarized in Table 4 below.

TABLE 4

| Interior temperature | Heater block | ΔT | Interior | Heat block temperature after attaching heat dissipation sheet | ΔT | Measurement time | ΣΔT |
|---|---|---|---|---|---|---|---|
| 25.3 | 72 | 46.7 | 25.3 | 59.4 | 34.1 | 15 min | 12.6 |

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

A heat dissipation sheet according to the present invention may be used as a heat dissipation material constituting a heat sink alone or with other materials with heat dissipation characteristics. In particular, the heat dissipation sheet according to the present invention may be used as a heat sink through complexation with an existing metal-based bulk-type heat sink or sheet/grease-type polymer. A heat sink including the heat dissipation sheet of the present invention can be used to efficiently dissipate heat of various electronic or mechanical components, e.g., LED devices, chips of electronic circuits, lines, vehicle engines, radiators, batteries, radiators of hot-air blowers and air conditioners, CPUs, etc.

DESCRIPTION OF SYMBOLS

1. STYROFOAM CONSTITUTING BOX
2. HEAT SINK
3. THERMOELECTRIC SEMICONDUCTOR HEATER
4. INPUT CURRENT CONTROLLER TO WHICH TEMPERATURE SENSOR IS ATTACHED
5. RECLOSABLE STYROFOAM UPPER PORTION
6. ALUMINIUM FOIL

The invention claimed is:

1. A method of manufacturing a heat dissipation sheet using a graphene/graphite nanoplate/carbon nanotube/nano-metal complex, the method comprising:
   preparing a first heat dissipation film by coating and sintering a composition for dissipating heat comprising a graphene/graphite nanoplate/carbon nanotube/nano-metal complex dispersion solution and a binder on a substrate and then removing the substrate; and
   forming a second heat dissipation film on one surface or two opposite surfaces of the first heat dissipation film by using a graphene adhesive comprising the graphene/graphite nanoplate/carbon nanotube/nano-metal complex dispersion solution and an adhesive,
   wherein the graphene/graphite nanoplate/carbon nanotube/nano-metal complex dispersion solution is prepared through a method comprising:
   expanding expandable graphite to obtain graphene worms;
   repeating twice or more heat-treating the ground graphene worms after grinding the graphene worms;
   cutting the ground and heat-treated graphene worms while homogenizing by means of a high pressure homogenizer after mixing the ground and heat-treated graphene worms with a solvent;
   forming a graphene/graphite nanoplate/nano-metal complex dispersion solution by adding a metal alkoxide coupling agent to a graphene layer binder dispersion solution obtained through the homogenizing and cutting and then performing ultrasonication; and forming the graphene/graphite nanoplate/carbon nanotube/nano-metal complex by adding an aqueous carbon nanotube dispersion solution to the formed graphene/graphite nanoplate/nano-metal complex dispersion solution and then stirring.

2. The method according to claim 1, wherein the forming comprises:
preparing a second heat dissipation film by coating the graphene adhesive on a release film; and
laminating a surface of the second heat dissipation film coated with the graphene adhesive on the one surface or two opposite surfaces of the first heat dissipation film.

3. The method according to claim 1, wherein the substrate is a thin metal or plastic film.

4. The method according to claim 1, wherein the binder is at least one binder resin selected from the group consisting of ethylcellulose resin, methylcellulose resin, and carboxymethylcellulose resin, or a mixture of at least one solvent selected from the group consisting of water, alcohol, methylethylketone, toluene, xylene, butylacetate, ethylacetate, isobutylacetate, cellosolveacetate, ethylcellosolve, and butylcellosolve and the binder resin.

5. The method according to claim 1, wherein the graphene/graphite nanoplate/carbon nanotube/nano-metal complex dispersion solution is comprised in an amount of 10 to 95% by weight in the composition for dissipating heat.

6. The method according to claim 1, wherein the sintering is performed at 400 to 600° C. for 1 to 40 minutes.

7. The method according to claim 1, wherein the substrate is coated with the composition for dissipating heat to a thickness of 30 to 100 μm.

8. The method according to claim 2, wherein the graphene adhesive comprises 30 to 60% by weight of the graphene/graphite nanoplate/carbon nanotube/nano-metal complex dispersion solution and 40 to 70% by weight of the adhesive, and the adhesive is any one of acrylic adhesives, silicon-based adhesives, and rubber-based adhesives.

9. The method according to claim 2, wherein the laminating is performed by rolling under a pressure of 350 to 700 kg.

10. The method according to claim 2, wherein the release film is coated with the graphene adhesive to a thickness of 2 to 20 μm.

11. The method according to claim 1, wherein a thickness of the heat dissipation sheet is 10 to 150 μm.

12. A heat dissipation sheet manufactured using a graphene/graphite nanoplate/carbon nanotube/nano-metal complex, the heat dissipation sheet comprising:
a first heat dissipation film obtained by sintering a composition for dissipating heat comprising a graphene/graphite nanoplate/carbon nanotube/nano-metal complex dispersion solution and a binder; and
a second heat dissipation film that comprises the graphene/graphite nanoplate/carbon nanotube/nano-metal complex dispersion solution and an adhesive and is formed on one surface or two opposite surfaces of the first heat dissipation film through coating or laminating,
wherein the graphene/graphite nanoplate/carbon nanotube/nano-metal complex dispersion solution is prepared through a method comprising:
expanding expandable graphite to obtain graphene worms;
repeating twice or more heat-treating the ground graphene worms after grinding the graphene worms
cutting ground and heat-treated graphene worms while homogenizing by means of a high pressure homogenizer after mixing the ground and heat-treated graphene worms with a solvent;
forming a graphene/graphite nanoplate/nano-metal complex dispersion solution by adding a metal alkoxide coupling agent to a graphene layer binder dispersion solution obtained through the homogenizing and cutting and then performing ultrasonication; and
forming the graphene/graphite nanoplate/carbon nanotube/nano-metal complex by adding an aqueous carbon nanotube dispersion solution to the formed graphene/graphite nanoplate/nano-metal complex dispersion solution and then stirring.

13. The heat dissipation sheet according to claim 12, wherein the graphene/graphite nanoplate/carbon nanotube/nano-metal complex dispersion solution is comprised in an amount of 10 to 95% by weight in the composition for dissipating heat.

14. The heat dissipation sheet according to claim 12, wherein the graphene adhesive comprises 30 to 60% by weight of the graphene/graphite nanoplate/carbon nanotube/nano-metal complex dispersion solution and 40 to 70% by weight of the adhesive.

15. The heat dissipation sheet according to claim 14, wherein the adhesive is any one of acrylic adhesives, silicon-based adhesives, and rubber-based adhesives.

16. The heat dissipation sheet according to claim 12, wherein a thickness of the heat dissipation sheet is 10 to 150 μm.

17. A heat sink comprising the heat dissipation sheet according to claim 12.

18. The heat sink according to claim 17, further comprising any one of metal, ceramics with heat dissipation properties, and polymers with heat dissipation properties.

\* \* \* \* \*